US010739284B2

United States Patent
Murano

(10) Patent No.: US 10,739,284 B2
(45) Date of Patent: Aug. 11, 2020

(54) X-RAY ANALYZER AND SPECTRUM GENERATION METHOD

(71) Applicant: JEOL Ltd., Tokyo (JP)

(72) Inventor: Takanori Murano, Tokyo (JP)

(73) Assignee: JEOL Ltd., Tokyo (JP)

( * ) Notice: Subject to any disclaimer, the term of this patent is extended or adjusted under 35 U.S.C. 154(b) by 187 days.

(21) Appl. No.: 16/101,633

(22) Filed: Aug. 13, 2018

(65) Prior Publication Data

US 2019/0049396 A1    Feb. 14, 2019

(30) Foreign Application Priority Data

Aug. 14, 2017   (JP) .................................. 2017-156519

(51) Int. Cl.
*G01T 1/36*    (2006.01)
*G01N 23/2252*    (2018.01)
*H01J 37/244*    (2006.01)

(52) U.S. Cl.
CPC ........... *G01N 23/2252* (2013.01); *G01T 1/36* (2013.01); *H01J 37/244* (2013.01); *H01J 2237/002* (2013.01); *H01J 2237/2445* (2013.01)

(58) Field of Classification Search
CPC ....... G01N 23/2252; G01N 23/18; G01T 1/36
See application file for complete search history.

(56) References Cited

U.S. PATENT DOCUMENTS

| 5,590,168 | A | * | 12/1996 | Iketaki | ..................... | G21K 7/00 |
| | | | | | | 378/161 |
| 8,421,007 | B2 | * | 4/2013 | Terauchi | ............ | G01N 23/2252 |
| | | | | | | 250/305 |
| 2002/0050564 | A1 | * | 5/2002 | Birk | ....................... | B82Y 20/00 |
| | | | | | | 250/306 |
| 2004/0061051 | A1 | * | 4/2004 | Schneiker | .............. | B82Y 10/00 |
| | | | | | | 250/306 |
| 2012/0292508 | A1 | * | 11/2012 | Terauchi | ............ | G01N 23/2252 |
| | | | | | | 250/310 |

FOREIGN PATENT DOCUMENTS

JP                201258146 A    3/2012

* cited by examiner

*Primary Examiner* — David P Porta
*Assistant Examiner* — Djura Malevic
(74) *Attorney, Agent, or Firm* — The Webb Law Firm

(57) ABSTRACT

An X-ray analyzer includes: a detector which detects X-rays generated from a specimen; a cooling element which cools the detector; and a spectrum generating unit which generates a spectrum based on a detection signal of the detector. The spectrum generating unit corrects an attenuation of intensity of a spectrum attributable to contamination of the detector, based on an elapsed time from a reference time until the X-rays are detected.

9 Claims, 9 Drawing Sheets

X-RAY ANALYZER AND SPECTRUM GENERATION METHOD

Japanese Patent Application No. 2017-156519, filed on Aug. 14, 2017, is hereby incorporated by reference in its entirety.

BACKGROUND OF THE INVENTION

The present invention relates to an X-ray analyzer and a spectrum generation method.

Methods of performing an elemental analysis of a specimen by irradiating the specimen with primary rays such as electron beams or X-rays and detecting X-rays generated from the specimen are known.

An example of such methods is energy-dispersive X-ray spectroscopy which involves irradiating a specimen with electron beams in an electron microscope and detecting X-rays generated from the specimen to measure a composition of the specimen. Energy-dispersive X-ray spectroscopy takes advantage of the fact that a characteristic X-ray has energy unique to elements constituting a specimen. In a spectrum of a characteristic X-ray obtained by energy-dispersive X-ray spectroscopy, an elemental species contained in a specimen is obtained from an energy value of a peak of the spectrum and a content of the elemental species is obtained from an area of the peak of the spectrum.

In addition, X-ray detection systems using a diffraction grating and a charge-coupled device (CCD) image sensor are known as another example of the methods described above. For example, with an X-ray detection system disclosed in JP-A-2012-58146, a specimen is irradiated with electron beams, X-rays (soft X-rays) generated from the specimen are collected by a mirror and dispersed by a diffraction grating, and dispersed X-rays (soft X-rays) are received by an X-ray CCD image sensor to acquire a spectrum.

With a detection device using a CCD image sensor, since the CCD image sensor is cooled, hydrocarbon or the like is deposited on a surface of the CCD image sensor and causes sensitivity of the CCD image sensor to decline.

For example, creating an ultra-high vacuum in a specimen chamber in which a detector is disposed enables a decline in the sensitivity of the detector due to such contamination to be suppressed. However, realizing an ultra-high vacuum is cost-intensive despite its limited effectiveness. Therefore, a technique capable of reducing an effect of a decline in sensitivity of a detector due to contamination by a simpler method is required.

SUMMARY

The present invention can provide an X-ray analyzer capable of reducing an effect of a decline in sensitivity of a detector due to contamination and a spectrum generation method capable of reducing an effect of a decline in sensitivity of a detector due to contamination.

According to a first aspect of the invention, there is provided an X-ray analyzer including:

a detector which detects X-rays generated from a specimen;

a cooling element which cools the detector; and a spectrum generating unit which generates a spectrum based on a detection signal from the detector, the spectrum generating unit correcting an attenuation of intensity of a spectrum attributable to contamination of the detector, based on an elapsed time from a reference time until the X-rays are detected.

According to a second aspect of the invention, there is provided a spectrum generation method for an X-ray analyzer which includes a detector for detecting X-rays generated from a specimen, and a cooling element for cooling the detector, the method including, when a spectrum is generated based on an output signal from the detector, correcting an attenuation of intensity of a spectrum attributable to contamination of the detector, based on an elapsed time from a reference time until the X-rays are detected.

Figure 1:
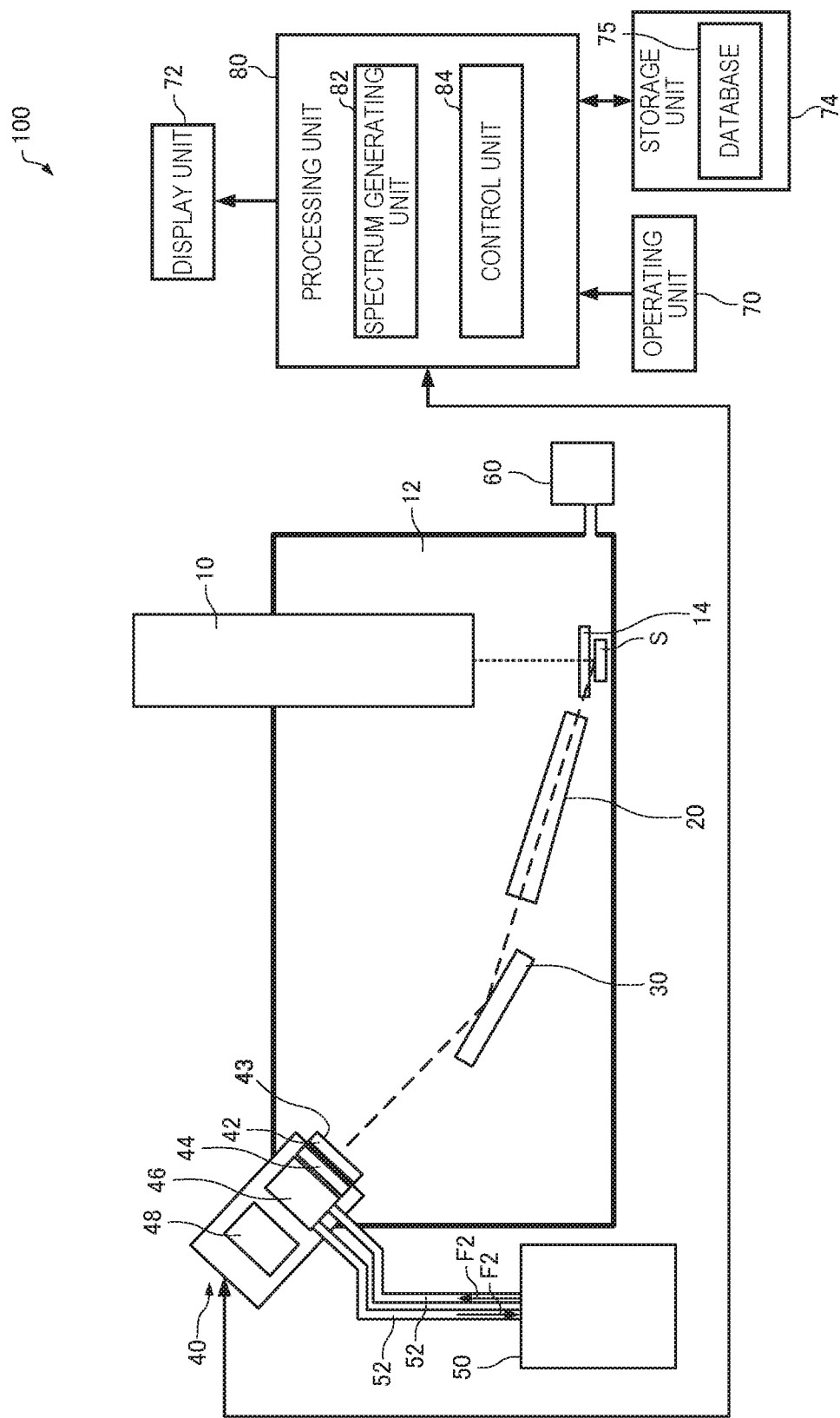
FIG. 1 is a diagram illustrating a configuration of an X-ray detection system according to a first embodiment.

DETAILED DESCRIPTION OF THE EMBODIMENT (1) According to one embodiment of the invention, there is provided an X-ray analyzer including:

a detector which detects X-rays generated from a specimen;

a cooling element which cools the detector; and a spectrum generating unit which generates a spectrum based on a detection signal from the detector, the spectrum generating unit correcting an attenuation of intensity of a spectrum attributable to contamination of the detector, based on an elapsed time from a reference time until the X-rays are detected.

With such an X-ray analyzer, an effect of a decline in sensitivity of a detector due to contamination can be reduced.

(2) In the X-ray analyzer described above, the spectrum generating unit may correct an attenuation of intensity of a spectrum for each energy.

A degree of decline in sensitivity of the detector due to contamination differs for each energy of X-rays. Therefore, with such an X-ray analyzer, correction of intensity with higher accuracy can be performed.

(3) The X-ray analyzer described above may further include:

a storage unit which stores a database indicating a relationship between an elapsed time from the reference time and an attenuation rate of intensity of a spectrum for each energy, and the spectrum generating unit may acquire information on an attenuation rate of intensity of a spectrum from the database to correct an attenuation of intensity of a spectrum.

With such an X-ray analyzer, an effect of a decline in sensitivity of a detector due to contamination can be readily reduced.

(4) In the X-ray analyzer described above, the reference time may be a time point when the temperature of the detector reaches a temperature at which the detector becomes capable of detection.

An amount of deposition of hydrocarbon or the like deposited on the detector after the detector reaches a temperature at which the detector becomes capable of detection is proportional relative to time and has reproducibility. Therefore, with such an X-ray analyzer, correction of intensity with high accuracy can be performed.

(5) The X-ray analyzer described above may further include:

a control unit which controls the cooling element, and the control unit may perform:

processing for stopping an operation of the cooling element at a first time point which has been set; and processing for starting an operation of the cooling element at a second time point which has been set.

With such an X-ray analyzer, a decline in sensitivity of a detector due to contamination can be suppressed without troubling a user.

(6) The X-ray analyzer described above may further include:

an input unit which accepts an input of the first time point and an input of the second time point.

With such an X-ray analyzer, a user can readily set a first time point and a second time point.

(7) The X-ray analyzer described above may further include:

a heat transfer medium generating unit which selectively generates a heat transfer medium for cooling the cooling element, and a heat transfer medium for heating the detector;

a heat source unit which is thermally connected to the cooling element and the detector and to which a heat transfer medium is supplied from the heat transfer medium generating unit; and an exhaust device connected to a space in which the detector is disposed.

With such an X-ray analyzer, while heating a detector, gas generated by heating the detector can be discharged. Therefore, with such an X-ray analyzer, contamination adhered to a surface of a detector can be readily removed.

(8) According to one embodiment of the invention, there is provided a spectrum generation method for an X-ray analyzer which includes a detector for detecting X-rays generated from a specimen, and a cooling element for cooling the detector, the method including, when a spectrum is generated based on an output signal from the detector, correcting an attenuation of intensity of a spectrum attributable to contamination of the detector, based on an elapsed time from a reference time until the X-rays are detected.

With such a spectrum generation method, an effect of a decline in sensitivity of a detector due to contamination can be reduced.

(9) The spectrum generation method described above may further include:

obtaining a relationship between an elapsed time from the reference time and a thickness of a deposition film deposited on the detector, obtaining a relationship between an elapsed time from the reference time and an attenuation rate of intensity of a spectrum based on the relationship between an elapsed time from the reference time and a thickness of the deposition film, and correcting an attenuation of intensity of a spectrum based on the obtained relationships.

With such a spectrum generation method, an effect of a decline in sensitivity of a detector due to contamination can be reduced.

Hereinafter, preferred embodiments of the present invention will be described in detail with reference to the drawings. It is to be understood that the embodiments described below are not intended to unreasonably limit contents of the present invention described in the claims. It is also to be understood that all of the components described below are not necessarily essential constituents of the present invention.

1. First Embodiment 1.1. X-Ray Detection System

First, an X-ray detection system (an example of the X-ray analyzer) according to a first embodiment will be described with reference to the drawings. FIG. 1 is a diagram illustrating a configuration of an X-ray detection system 100 according to the first embodiment. It should be noted that FIG. 1 illustrates a state in the X-ray detection system 100 where an X-ray detection device 40 is operational or, in other words, a state where a solid-state imaging element 42 is cooled and X-rays can be detected.

As illustrated in FIG. 1, the X-ray detection system 100 includes an electron beam irradiating unit 10, an X-ray focusing mirror unit 20, a diffraction grating 30, the X-ray detection device 40, a chiller 50, an exhaust device 60, an operating unit 70, a display unit 72, a storage unit 74, and a processing unit 80.

The electron beam irradiating unit 10 irradiates a specimen S with an electron beam. The electron beam irradiating unit 10 is configured so as to include an electron gun as an electron beam source and an illumination lens system for irradiating the specimen S with an electron beam emitted from the electron gun. The X-ray detection system 100 may be equipped with a function as a scanning electron microscope for acquiring a scanning electron microscope image (an SEM image).

In the X-ray detection system 100, an electrostatic deflection plate 14 is disposed above the specimen S. When the specimen S is irradiated by an electron beam, a backscattered electron, a secondary electron, and the like are generated in addition to characteristic X-rays (characteristic soft X-rays) from the specimen S. Disposing the electrostatic deflection plate 14 enables a backscattered electron, a secondary electron, and the like to be removed. In addition, since a potential applied to the electrostatic deflection plate 14 is variable, background can be reduced by applying a potential in accordance with an accelerating voltage of the electron beam.

The X-ray focusing mirror unit 20 focuses the characteristic X-rays (characteristic soft X-rays) emitted from the specimen S and guides the characteristic X-rays (characteristic soft X-rays) to the diffraction grating 30. By focusing characteristic X-rays with the X-ray focusing mirror unit 20, an intensity of characteristic X-rays incident to the diffraction grating 30 can be increased. Accordingly, a reduction in measurement time and an improvement in an S/N ratio of a spectrum can be achieved.

For example, the X-ray focusing mirror unit 20 is constituted by two mirrors that oppose each other. An interval between the two mirrors is narrower on a side of the specimen S (an incidence side) and wider on a side of the diffraction grating 30 (an exit side). Accordingly, an intensity of characteristic X-rays incident to the diffraction grating 30 can be increased.

The diffraction grating 30 receives the characteristic X-rays focused by the X-ray focusing mirror unit 20 and generates diffracted X-rays of which a diffraction state differs in accordance with energy. The diffraction grating 30 is an unequally-spaced diffraction grating in which unequally-spaced grooves are formed for the purpose of aberration correction. The diffraction grating 30 is configured such that, when characteristic X-rays are incident at a large angle of incidence, a focal point of the diffracted X-rays are formed on a light-receiving surface 43 of the solid-state imaging element 42 instead of on a Rowland circle.

The X-ray detection device 40 detects diffracted X-rays. The X-ray detection device 40 is configured so as to include the solid-state imaging element 42 (an example of the detector), a cooling element 44, a cooling unit 46, and a controller 48.

The solid-state imaging element 42 detects diffracted X-rays. The solid-state imaging element 42 is a solid-state imaging element with high sensitivity with respect to soft X-rays.

For example, the solid-state imaging element 42 is a charge coupled device (CCD) image sensor or a complementary MOS (CMOS) image sensor. For example, the solid-state imaging element 42 is a back-illuminated CCD image sensor (or CMOS image sensor).

The position of the solid-state imaging element 42 is adjusted so that the light-receiving surface 43 is consistent with an imaging plane of the diffracted X-rays.

The cooling element 44 cools the solid-state imaging element 42. The solid-state imaging element 42 is cooled by the cooling element 44 to, for example, around −70 degrees. Accordingly, the solid-state imaging element 42 becomes capable of detection with high sensitivity. The cooling element 44 is, for example, a Peltier element.

The cooling unit 46 cools the cooling element 44. The cooling unit 46 cools a heat radiating part of the Peltier element. Cold water F2 (a cooling heat transfer medium) at a prescribed temperature (for example, 20 degrees) is supplied to the cooling unit 46 from the chiller 50. The cooling unit 46 cools the cooling element 44 using the cold water F2.

In the illustrated example, the cooling unit 46 and the chiller 50 are connected by a pipe 52. Connecting the chiller 50 and the cooling unit 46 with each other by the pipe 52 enables the cold water F2 to be circulated between the chiller 50 and the cooling unit 46. Since the cooling unit 46 is thermally connected to the cooling element 44 (the heat radiating part of the Peltier element), circulating the cold water F2 enables the cooling element 44 to be cooled.

The controller 48 controls the solid-state imaging element 42 and the cooling element 44. The controller 48 supplies power to the solid-state imaging element 42 and the cooling element 44. In addition, the controller 48 performs processing for outputting a detection signal of the solid-state imaging element 42 to the processing unit 80.

The chiller 50 cools water as a heat transfer medium to generate the cold water F2. The chiller 50 supplies the cold water F2 to the cooling unit 46 while maintaining the cold water F2 at a constant temperature. The chiller 50 circulates the cold water F2 between the chiller 50 and the cooling unit 46. The cold water F2 is, for example, water at 20 degrees. It should be noted that the temperature of the cold water F2 can be set as appropriate in accordance with the temperature of the cooling element 44.

While an example of cooling the cooling element 44 with the cold water F2 has been described, the cooling heat transfer medium for cooling the cooling element 44 need only be a fluid capable of cooling the cooling element 44 and may be an oil, a gas, or the like.

The exhaust device 60 is connected to an inside (an internal space) of a specimen chamber 12 in which the specimen S, the X-ray focusing mirror unit 20, the diffraction grating 30, and the X-ray detection device 40 (the solid-state imaging element 42) are disposed. The exhaust device 60 pumps the specimen chamber 12. Accordingly, the specimen chamber 12 can be placed in a decompressed state. The exhaust device 60 is, for example, a turbo-molecular pump, an oil diffusion pump, or an ion pump.

The operating unit 70 (an example of the input unit) performs processing for acquiring an operation signal that corresponds to an operation performed by the user and sending the operation signal to the processing unit 80. For example, functions of the operating unit 70 can be implemented by a button, a key, a touch panel display, or a microphone.

The display unit 72 displays an image generated by the processing unit 80, and functions thereof can be implemented by an LCD, a CRT, or the like.

The storage unit 74 stores a program, data, and the like which cause or allow the processing unit 80 to perform various calculation processes. In addition, the storage unit 74 is used as a work area for the processing unit 80, and temporarily stores results of calculations and the like performed by the processing unit 80 according to various programs. Functions of the storage unit 74 can be implemented by a hard disk, a RAM, or the like.

The storage unit 74 stores a database 75 used when the spectrum generating unit 82 (to be described later) generates a spectrum. The database 75 is a database indicating a relationship between an elapsed time from a reference time (for example, a time point when, due to the cooling element 44, the solid-state imaging element 42 reaches a temperature (for example, −70 degrees) at which the solid-state imaging element 42 is capable of detection) and an attenuation rate of intensity of a spectrum for each energy.

The processing unit 80 performs processing such as processing for generating a spectrum based on a detection signal of the solid-state imaging element 42 and processing for controlling the cooling element 44. Functions of the processing unit 80 can be implemented by having various processors (a CPU, DSP, and the like) execute programs. It should be noted that at least part of the functions of the processing unit 80 may be realized by a dedicated circuit such as an ASIC (a gate array or the like). The processing unit 80 includes the spectrum generating unit 82 and a control unit 84.

The spectrum generating unit 82 generates a spectrum based on a detection signal output from the solid-state imaging element 42. The control unit 84 controls the cooling element 44. Details of processing by the spectrum generating unit 82 and processing by the control unit 84 will be provided in "1.2. Processing" below.

1.2. Processing

Next, processing by the processing unit 80 of the X-ray detection system 100 will be described.

(1) Spectrum Generation

A generation method of a spectrum according to the first embodiment includes the steps of: preparing the database 75 which indicates a relationship between an elapsed time from a reference time and an attenuation rate of intensity of a spectrum for each energy; and generating a spectrum based on a detection signal of the solid-state imaging element 42, wherein in the step of generating a spectrum, an attenuation of intensity of a spectrum attributable to contamination of the solid-state imaging element 42 is corrected based on an elapsed time from the reference time until X-rays are detected.

In the X-ray detection system 100, the spectrum generating unit 82 generates a spectrum. The spectrum generating unit 82 generates a spectrum based on a detection signal from the solid-state imaging element 42. Specifically, the spectrum generating unit 82 analyzes diffracted X-rays (a detection signal) having been diffracted by the diffraction grating 30 and detected by the solid-state imaging element 42, and generates a spectrum (an energy distribution spectrum) signifying how many X-rays have been detected for each energy.

In this case, since the solid-state imaging element 42 is cooled by the cooling element 44, hydrocarbon or the like is deposited (contamination) on the light-receiving surface 43 of the solid-state imaging element 42. As a result, sensitivity of the solid-state imaging element 42 declines and intensity of a spectrum attenuates. An amount of deposition (a thickness of a deposition film) of the hydrocarbon or the like is proportional to time and has reproducibility unless a degree of vacuum of the specimen chamber 12 changes significantly. Therefore, the attenuation of intensity of a spectrum attributable to contamination of the solid-state imaging element 42 can be corrected by measuring, in advance, an attenuation rate of intensity of a spectrum (a rate of decline in the intensity of a spectrum relative to the elapsed time).

It should be noted that that a degree of decline in sensitivity of the solid-state imaging element 42 due to contamination differs for each energy. Consequently, the attenuation rate of intensity of a spectrum attributable to contamination differs for each energy. Therefore, the attenuation rate of the intensity of a spectrum is preferably measured for each energy.

In the first embodiment, by adopting a time point when the solid-state imaging element 42 reaches a temperature (for example, −70 degrees) at which the solid-state imaging element 42 is capable of detection as a reference time, a database (the database 75) indicating a relationship between an elapsed time from the reference time and an attenuation rate of the intensity of a spectrum for each energy is prepared to correct the attenuation of intensity of a spectrum.

To create the database 75, first, by adopting a time point when the solid-state imaging element 42 reaches a temperature at which the solid-state imaging element 42 is capable of detection from a state where the solid-state imaging element 42 is at room temperature as the reference time, a standard specimen is measured by the X-ray detection system 100 at prescribed time intervals and a spectrum is acquired for each elapsed time.

Next, from the spectrum for each elapsed time, an attenuation rate of the intensity of a spectrum for each energy during each elapsed time is obtained. When soft X-rays are to be measured by the X-ray detection device 40, examples of energy of which an attenuation rate is to be obtained include carbon (K-line 277 eV), silicon (L-line 100 eV), aluminum (L-line 73 eV), cobalt (M-line 58 eV), and iron (M-line 51 eV). Attenuation rates between these energies are complemented from the attenuation rates of these energies. Due to the steps described above, the database 75 can be created.

Figure 2:
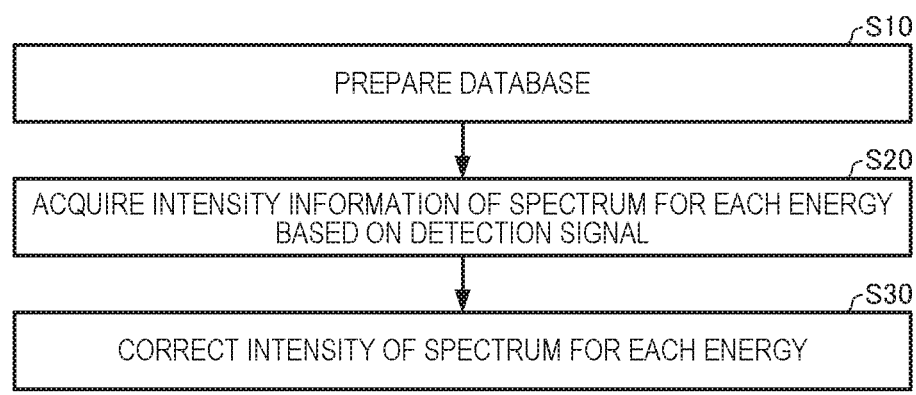
FIG. 2 is a flow chart illustrating an example of a generation method of a spectrum according to the first embodiment.

FIG. 2 is a flow chart illustrating an example of a generation method of a spectrum according to the first embodiment.

First, the database 75 is prepared (step S10).

A method of creating the database 75 is as described above. The created database 75 is stored in the storage unit 74.

Next, the specimen S is measured by the X-ray detection system 100 and, based on a detection signal of the solid-state imaging element 42, the spectrum generating unit 82 acquires information on X-ray intensity (the number of X-rays) for each energy (step S20). At this point, the spectrum generating unit 82 acquires information on a time point (a detection time point) when the solid-state imaging element 42 detects X-rays. The detection time point is, for example, a time point when detection of X-rays is started. Alternatively, the detection time point may be a time point when detection of X-rays is ended.

Next, the spectrum generating unit 82 corrects, for each energy, an attenuation of intensity of a spectrum attributable to contamination based on an elapsed time from the reference time until X-rays are detected (step S30).

Specifically, the spectrum generating unit 82 obtains an elapsed time from the reference time to the detection time point and reads information on an attenuation rate of intensity of each energy at the obtained elapsed time from the database 75 stored in the storage unit 74. It should be noted that the storage unit 74 stores information at the reference time, and the spectrum generating unit 82 acquires information at the reference time by reading information at the reference time from the storage unit 74.

Next, based on the information on the attenuation rate of intensity of each energy acquired from the database 75, the spectrum generating unit 82 corrects the attenuation of intensity of a spectrum for each energy.

Figure 3:
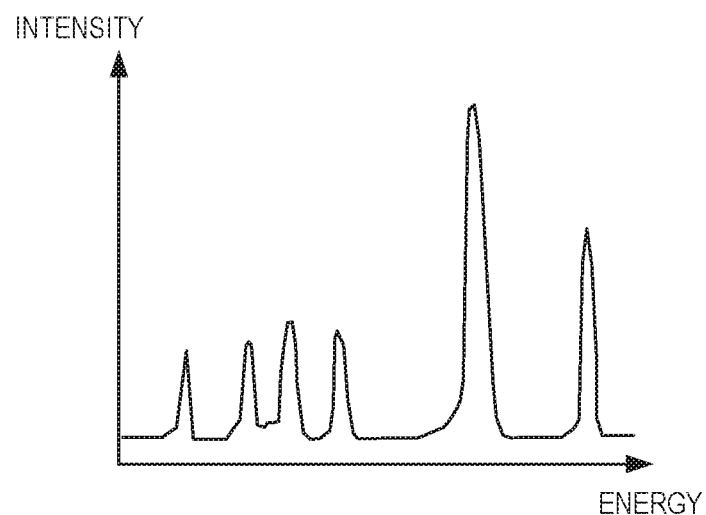
FIG. 3 is a chart schematically illustrating a spectrum prior to correcting an attenuation of intensity of the spectrum attributable to contamination.
Figure 4:
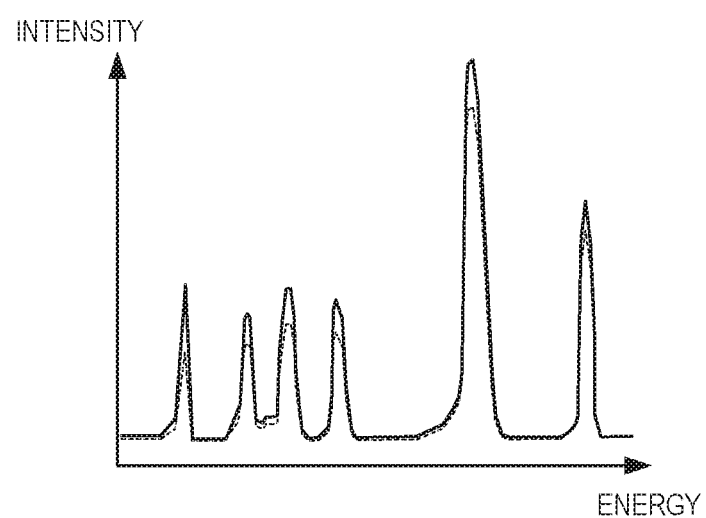
FIG. 4 is a chart schematically illustrating a spectrum after correcting an attenuation of intensity of the spectrum attributable to contamination.

FIG. 3 is a chart schematically illustrating a spectrum prior to correcting an attenuation of intensity of the spectrum attributable to contamination. FIG. 4 is a chart schematically illustrating a spectrum after correcting an attenuation of intensity of the spectrum attributable to contamination. In FIG. 4, the spectrum prior to correction is indicated by a dashed line and the spectrum after correction is indicated by a solid line.

As a result of the spectrum generating unit 82 correcting the attenuation of intensity of a spectrum attributable to contamination, as illustrated in FIGS. 3 and 4, the intensity of a spectrum increases by an amount of attenuation of intensity of the spectrum attributable to contamination of the solid-state imaging element 42.

The spectrum generating unit 82 performs processing for displaying the corrected spectrum illustrated in FIG. 4 on the display unit 72.

While an example of measuring a single spectrum or, in other words, performing a point analysis with the X-ray detection system 100 has been described above, the X-ray detection system 100 is also capable of scanning an electron beam to perform an area analysis (mapping). In this case, the spectrum generating unit 82 acquires a detection time point for each point in an area subjected to the area analysis, reads information on an attenuation rate of intensity during an elapsed time from the reference time to the detection time point from the database 75 for each point, and corrects the attenuation in the intensity of a spectrum.

Alternatively, the spectrum generating unit 82 may adopt a time point when the area analysis is started or a time point when the area analysis is ended as the detection time point, and read information on the attenuation rate of intensity from the database 75 to correct the attenuation of intensity of a spectrum at each point. In this case, since information on an attenuation rate need not be read from the database 75 for each point, processing can be accelerated.

(2) Control of Cooling Element

Figure 5:
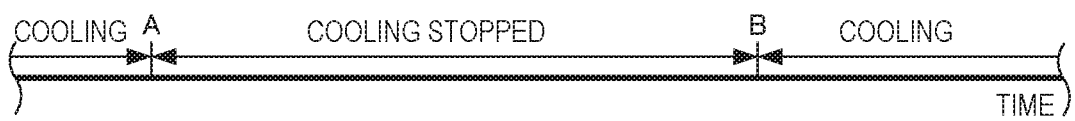
FIG. 5 is a diagram for explaining processing by a control unit of the X-ray detection system according to the first embodiment.
Figure 6:
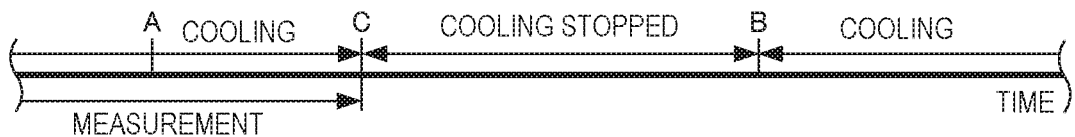
FIG. 6 is a diagram for explaining processing by the control unit of the X-ray detection system according to the first embodiment.
Figure 7:
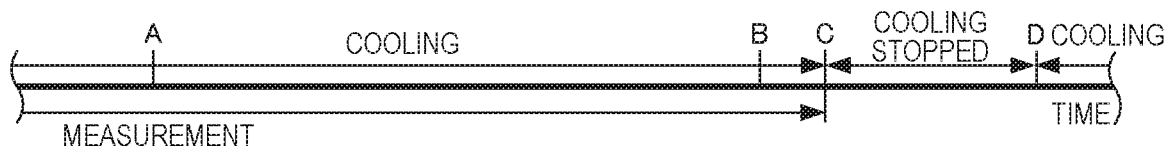
FIG. 7 is a diagram for explaining processing by the control unit of the X-ray detection system according to the first embodiment.

FIGS. 5 to 7 are diagrams for explaining processing by the control unit 84.

In the X-ray detection system 100, the control unit 84 performs control of the cooling element 44.

As illustrated in FIG. 5, when a cooling stop time point A (the first time point) and a cooling restart time point B (the second time point) are set, the control unit 84 performs control so as to stop operation of the cooling element 44 at the set cooling stop time point A and performs control so as to start (restart) operation of the cooling element 44 at the set cooling restart time point B.

In the X-ray detection system 100, the operating unit 70 functions as the input unit for accepting inputs of the cooling stop time point A and the cooling restart time point B. For example, when the user performs an operation of inputting the cooling stop time point A and the cooling restart time point B with respect to the operating unit 70, based on an operation signal of the operating unit 70, the control unit 84 stops the operation of the cooling element 44 at the cooling stop time point A and starts the operation of the cooling element 44 at the cooling restart time point B.

For example, when 17:00 is set as the cooling stop time point A and 9:00 is set as the cooling restart time point B, the operation of the cooling element 44 stops from 17:00 to 9:00.

In this case, hydrocarbon or the like deposited on the light-receiving surface 43 due to cooling by the cooling element 44 is dispersed inside the specimen chamber 12 by stopping the cooling of the solid-state imaging element 42. Therefore, when the solid-state imaging element 42 is not being used, cooling of the solid-state imaging element 42 is desirably stopped to raise the temperature of the solid-state imaging element 42 (for example, restore the temperature thereof to room temperature).

As described above, in the X-ray detection system 100, by having the user input the cooling stop time point A and the cooling restart time point B, the operation of the cooling element 44 can be automatically stopped from the cooling stop time point A to the cooling restart time point B and cooling of the solid-state imaging element 42 can be stopped.

When measurement is performed after the cooling stop time point A as illustrated in FIG. 6, the control unit 84 stops the operation of the cooling element 44 after the cooling stop time point A and at a measurement stop time point C. For example, when the measurement stop time point C is 19:00, the operation of the cooling element 44 is stopped from 19:00 to 9:00.

In addition, as illustrated in FIG. 7, when the control unit 84 determines that the measurement stop time point C exceeds the cooling stop time point A and the cooling restart time point B based on measurement conditions or the like, the control unit 84 requests the user to input a next measurement time point D. When the operating unit 70 accepts an input of the next measurement time point D, the control unit 84 stops the operation of the cooling element 44 at the measurement stop time point C and starts the operation of the cooling element 44 at the next measurement time point D. For example, when the measurement stop time point C is 10:00 and the next measurement time point D is set to 12:00, the operation of the cooling element 44 is stopped from 10:00 to 12:00.

As described in "(1) Spectrum generation" above, when correcting an attenuation of intensity of a spectrum attributable to contamination, information at the reference time or, in other words, information at a time point when the solid-state imaging element 42 reaches a temperature (for example, −70 degrees) at which the solid-state imaging element 42 is capable of detection is required. To this end, after performing control to start the operation of the cooling element 44 at the cooling restart time point B illustrated in FIGS. 5 and 6 or after performing control to start the operation of the cooling element 44 at the next measurement time point D illustrated in FIG. 7, at a time point when the solid-state imaging element 42 reaches a temperature at which the solid-state imaging element 42 is capable of detection, the control unit 84 performs processing for storing information at the time point or, in other words, information at the reference time in the storage unit 74.

1.3. Cleaning Method of Solid-State Imaging Element

Figure 8:
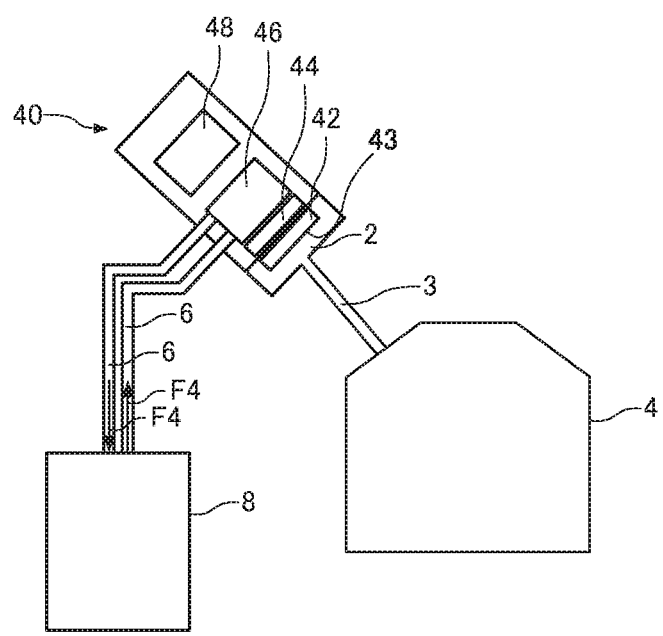
FIG. 8 is a diagram schematically illustrating a cleaning step of a solid-state imaging element according to the first embodiment.

Next, a cleaning method of a solid-state imaging element according to the first embodiment will be described with reference to the drawings. FIG. 8 is a diagram schematically illustrating a cleaning step of a solid-state imaging element according to the first embodiment.

First, as illustrated in FIG. 8, the X-ray detection device 40 is taken out from a case of the X-ray detection system 100. Subsequently, the solid-state imaging element 42 is hermetically sealed by a vacuum sealing flange 2. A space sealed by the vacuum sealing flange 2 is pumped (evacuated) by an exhaust device 4 via a vacuum pipe 3. At this point, supply of power to the controller 48 is stopped. The exhaust device 4 is, for example, an oil rotary pump, a scroll pump, or a turbo-molecular pump.

Next, a pipe 6 is connected to the cooling unit 46 of the X-ray detection device 40 and a hot-water circulator 8 is mounted. The hot-water circulator 8 heats water as a heat transfer medium and generates hot water F4 (a heating heat transfer medium). The hot-water circulator 8 supplies the hot water F4 to the cooling unit 46 while maintaining the hot water F4 at a constant temperature. The hot-water circulator 8 circulates the hot water F4 between the hot-water circulator 8 and the cooling unit 46.

Next, the solid-state imaging element 42 is heated. The solid-state imaging element 42 can be heated by having the hot-water circulator (for example, a chiller) 8 circulate the hot water F4 between the hot-water circulator 8 and the cooling unit 46.

Heating the solid-state imaging element 42 causes contamination (a deposition film of hydrocarbon or the like) adhered to a surface (the light-receiving surface 43) of the solid-state imaging element 42 to be released as gas. The released gas is discharged by the exhaust device 4. In this manner, by heating the solid-state imaging element 42 and, at the same time, discharging the gas generated by heating the solid-state imaging element 42, contamination (a deposition film of hydrocarbon or the like) adhered to the surface of the solid-state imaging element 42 can be removed.

At this point, a surface temperature of the solid-state imaging element 42 must be set to, for example, 50 degrees or higher. When the surface temperature of the solid-state imaging element 42 is lower than 50 degrees, contamination adhered to the surface of the solid-state imaging element 42 cannot be sufficiently removed. In consideration of temperature exchange efficiency, the temperature of the hot water F4 must be set to several degrees higher than a desired surface temperature of the solid-state imaging element 42. Although the higher the surface temperature of the solid-state imaging element 42 and the temperature of the hot water F4, the higher the removal efficiency of contamination on the surface of the solid-state imaging element 42, a possibility that the solid-state imaging element 42 may break increases significantly when the surface temperature of the solid-state imaging element 42 exceeds an upper temperature limit of the solid-state imaging element 42. Therefore, the temperature of the hot water F4 must be set to a temperature which causes the surface temperature of the solid-state imaging element 42 to equal or fall below the upper temperature limit of the solid-state imaging element 42. The temperature of the hot water F4 is, for example, 50 degrees or higher and 90 degrees or lower.

In addition, desirably, the temperature of the hot water F4 is gradually raised. Accordingly, since the temperature of the solid-state imaging element 42 can be gradually raised, the possibility of breakage of the solid-state imaging element 42 due to an abrupt temperature rise of the solid-state imaging element 42 can be reduced.

By performing, for a prescribed period of time, processing for heating the solid-state imaging element 42 and, at the same time, discharging the gas generated by heating the solid-state imaging element 42, contamination accumulated on the surface of the solid-state imaging element 42 can be removed.

The solid-state imaging element 42 can be cleaned by the step described above.

Once cleaning of the solid-state imaging element 42 is finished, as illustrated in FIG. 1, the X-ray detection device 40 is mounted to the case of the X-ray detection system 100 and the position of the X-ray detection device 40 is adjusted so that the light-receiving surface 43 of the solid-state imaging element 42 is consistent with an imaging plane of the diffracted X-rays.

In the embodiment described above, as illustrated in FIG. 8, an exhaust system is constituted by the vacuum sealing flange 2, the vacuum pipe 3 and the exhaust device 4 and discharges gas generated by heating the solid-state imaging element 42. Conversely, although not illustrated, for example, when the X-ray detection system 100 is provided with an exhaust system which discharges the solid-state imaging element 42 separately from an exhaust system which pumps the electron beam irradiating unit 10 and the specimen chamber 12, the cleaning of the solid-state imaging element 42 described above may be performed using the exhaust system for discharging the solid-state imaging element 42 while keeping the X-ray detection device 40 mounted to the X-ray detection system 100.

1.4. Features

For example, the X-ray detection system 100 according to the first embodiment and the spectrum generation method according to the first embodiment have the following features.

In the X-ray detection system 100, the spectrum generating unit 82 corrects an attenuation of intensity of a spectrum attributable to contamination based on an elapsed time from a reference time to a detection time point. Therefore, with the X-ray detection system 100, an effect of a decline in sensitivity of the solid-state imaging element 42 due to contamination can be reduced.

In the X-ray detection system 100, the spectrum generating unit 82 corrects an attenuation of intensity of a spectrum for each energy. A degree of decline in sensitivity of the solid-state imaging element 42 due to contamination differs for each energy. Therefore, the X-ray detection system 100 is capable of performing correction of intensity with higher accuracy.

In the X-ray detection system 100, the storage unit 74 stores the database 75 indicating a relationship between an elapsed time from the reference time and an attenuation rate of intensity of a spectrum for each energy, and the spectrum generating unit 82 corrects an attenuation of intensity of a spectrum by acquiring information on the attenuation rate of intensity of a spectrum from the database 75. Therefore, with the X-ray detection system 100, an effect of a decline in sensitivity of the solid-state imaging element 42 due to contamination can be readily reduced.

In the X-ray detection system 100, the reference time is a time point when the solid-state imaging element 42 reaches a temperature at which the solid-state imaging element 42 becomes capable of detection. An amount of deposition of hydrocarbon or the like after the solid-state imaging element 42 reaches a temperature at which the solid-state imaging element 42 becomes capable of detection is proportional relative to time and has reproducibility. Therefore, the X-ray detection system 100 is capable of performing correction of intensity with higher accuracy.

In the X-ray detection system 100, the control unit 84 performs processing for stopping the operation of the cooling element 44 at a set cooling stop time point A and performs processing for starting the operations of the cooling element 44 at a set cooling restart time point B. Therefore, with the X-ray detection system 100, an effect of a decline in sensitivity of the solid-state imaging element 42 due to contamination can be reduced without troubling the user. In addition, in the X-ray detection system 100, since a period of time during which the solid-state imaging element 42 is cooled can be shortened, energy saving can be achieved.

The X-ray detection system 100 includes the operating unit 70 as an input unit for accepting inputs of the cooling stop time point A and the cooling restart time point B. Therefore, the user can readily set the cooling stop time point A and the cooling restart time point B.

In the spectrum generation method according to the first embodiment, an attenuation of intensity of a spectrum attributable to contamination of the solid-state imaging element 42 is corrected based on an elapsed time from the reference time to a detection time point. Therefore, an effect of a decline in sensitivity of the solid-state imaging element 42 due to contamination can be reduced.

1.5. Modifications

Next, modifications of the first embodiment will be described. The following description will focus on points that differ from the example of the X-ray detection system 100 described above and descriptions of similar points will be omitted.

(1) First Modification

First, a first modification will be described. In the embodiment described above, in the step of preparing the database 75 (step S10), the database 75 is created by measuring a standard specimen at prescribed time intervals and obtaining a relationship between an elapsed time from a reference time and an attenuation rate of intensity of a spectrum for each energy.

Conversely, in the first modification, in the step of preparing the database 75 (step S10), the database 75 is created by measuring a standard specimen at prescribed time intervals, obtaining a relationship between an elapsed time from a reference time and a thickness of a deposition film that is deposited on the light-receiving surface 43 of the solid-state imaging element 42, and obtaining, from the relationship, a relationship between the elapsed time from the reference time and an attenuation rate of intensity of a spectrum.

Specifically, first, a standard specimen is measured at prescribed time intervals, and a film thickness of a deposition film (a carbon film) deposited on the light-receiving surface 43 of the solid-state imaging element 42 is calculated for each elapsed time. Since a mass absorption coefficient of carbon is known, the film thickness of the deposition film can be calculated based on intensity of energy (for example, intensity of aluminum (L-line 73 eV)) that serves as a basis in the spectrum.

Next, based on the film thickness of the deposition film and the absorption coefficient, an attenuation rate of intensity of the entire spectrum (of all energy ranges of the spectrum) is calculated for each elapsed time. Accordingly, the database 75 indicating a relationship between the elapsed time and the attenuation rate of intensity of the entire spectrum (of all energy ranges of the spectrum) can be created.

According to the first modification, the database 75 can be created in a similar manner to the embodiment described above.

(2) Second Modification

Figure 9:
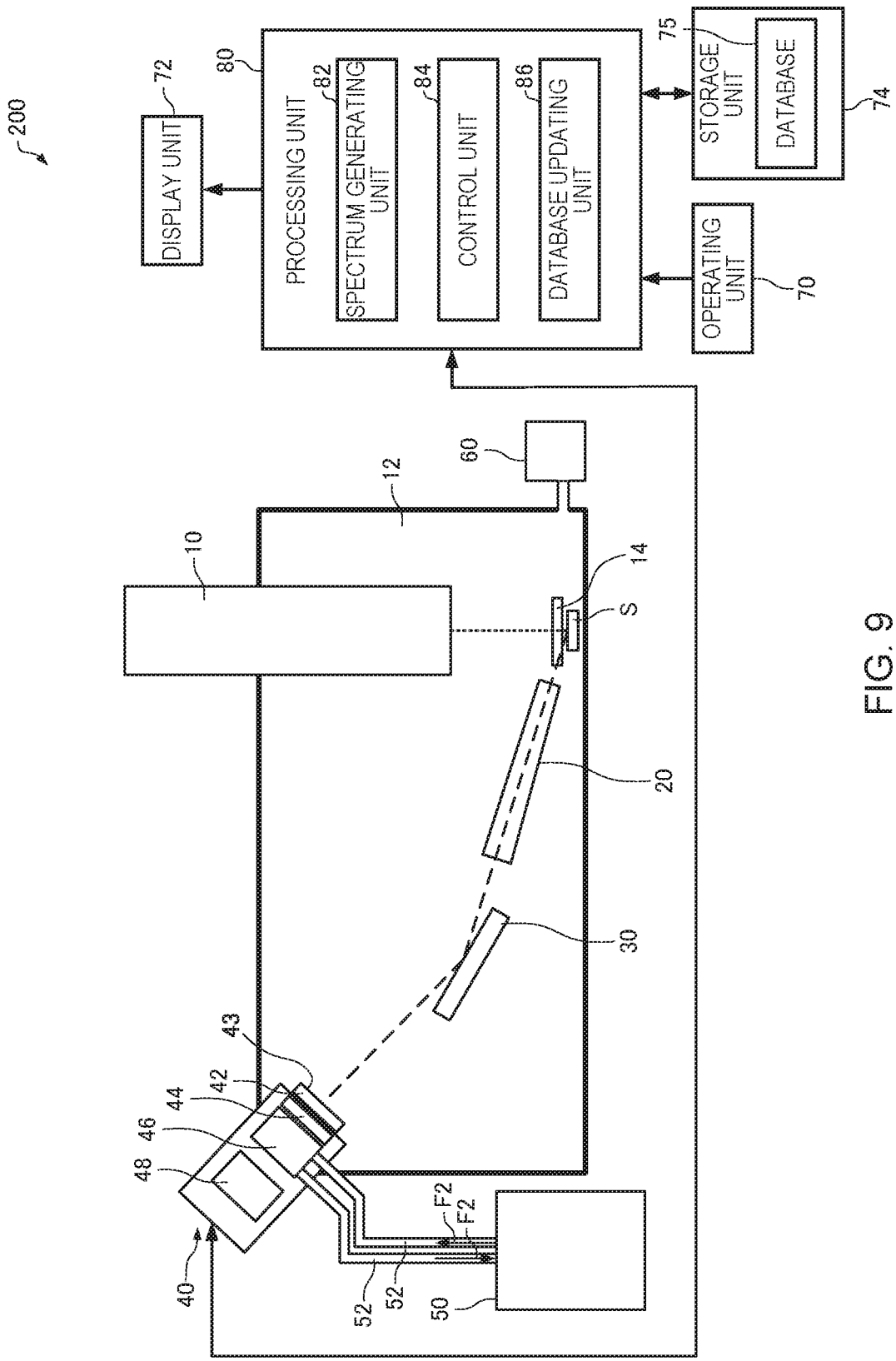
FIG. 9 is a diagram illustrating a configuration of an X-ray detection system according to a second modification.

Next, an X-ray detection system according to a second modification will be described with reference to the drawings. FIG. 9 is a diagram illustrating a configuration of an X-ray detection system 200 according to the second modification.

In the X-ray detection system 200, as illustrated in FIG. 9, the processing unit 80 includes a database updating unit 86.

For example, when analyses of a plurality of locations of the specimen S are performed in the X-ray detection system 200, the database updating unit 86 measures intensity of energy (for example, intensity of aluminum (L-line 73 eV)) that serves as a basis in the spectrum during each analysis, obtains a relationship between the elapsed time and the attenuation rate of intensity of a spectrum, and writes the obtained relationship into the database 75 to update the database 75. As a result, in the second modification, an attenuation of intensity attributable to contamination can be corrected in accordance with, for example, a degree of vacuum of the specimen chamber 12 in addition to the elapsed time.

It should be noted that a timing when the database updating unit 86 performs processing for updating the database 75 is not particularly limited and, for example, the processing for updating the database 75 may be performed in response to a request from the user.

In addition, in the second modification, when there is a large deviation (for example, when there is a large difference) between the attenuation rate newly obtained by the database updating unit 86 (the attenuation rate after the update) and the attenuation rate prior to the update, the control unit 84 performs processing for notifying the user to perform cleaning of the solid-state imaging element 42. For example, the notification is performed by displaying a message on the display unit 72, lighting a warning lamp (not shown), sounding a buzzer, or the like. A method of notification is not particularly limited.

In addition, the control unit 84 may automatically measure intensity of energy to serve as a basis in the spectrum, determine whether or not cleaning of the solid-state imaging element 42 is necessary based on a result of the measurement, and perform processing of notifying the user to perform cleaning. Specifically, the control unit 84 first measures the specimen S at prescribed time intervals during a period from start of cooling of the solid-state imaging element 42 until the solid-state imaging element 42 is cooled to a temperature at which the solid-state imaging element 42 becomes capable of detection, monitors intensity of energy (for example, intensity of aluminum (L-line 73 eV)) that serves as a basis in the spectrum, and obtains an attenuation rate of the intensity. In addition, based on the obtained attenuation rate of the intensity, the control unit 84 determines whether or not cleaning is necessary.

When the control unit 84 determines that the attenuation rate of the intensity is equal to or higher than a prescribed value, the control unit 84 performs processing for notifying the user to perform cleaning of the solid-state imaging element 42. When the control unit 84 determines that the attenuation rate of the intensity is lower than a prescribed value, the control unit 84 notifies that a measurement can be performed.

While a case where the control unit 84 determines whether or not cleaning of the solid-state imaging element 42 is necessary based on an attenuation rate of intensity of a spectrum has been described above, alternatively, the control unit 84 may determine whether or not cleaning of the solid-state imaging element 42 is necessary based on intensity of a spectrum for each elapsed time.

According to the second modification, since the database updating unit 86 updates the database 75, correction of intensity can be performed with higher accuracy. In addition, according to the second modification, cleaning of the solid-state imaging element 42 can be performed at an appropriate timing and a decline in sensitivity of the solid-state imaging element 42 due to contamination can be suppressed.

2. Second Embodiment

2.1. X-Ray Detection System

Next, an X-ray detection system according to a second embodiment will be described. A configuration of the X-ray detection system according to the second embodiment is the same as the configuration of the X-ray detection system 100 according to the first embodiment illustrated in FIG. 1 and therefore will not be illustrated.

In the X-ray detection system according to the second embodiment, the chiller 50 is configured so as to be capable of cooling and heating water as a heat transfer medium and is capable of selectively generating cold water F2 and hot water F4. In other words, the chiller 50 functions as the heat transfer medium generating unit which selectively generates a cooling heat transfer medium (the cold water F2) for cooling the cooling element 44 and a heating heat transfer medium (the hot water F4) for heating the solid-state imaging element 42.

Therefore, in the X-ray detection system according to the second embodiment, in a state illustrated in FIG. 1 where the X-ray detection device 40 is operating (a state where X-rays can be detected), the chiller 50 cools water as the heat transfer medium to create cold water F2 and the cold water F2 is supplied to the cooling unit 46 to cool the cooling element 44. In addition, during cleaning of the solid-state imaging element 42 to be described later, the chiller 50 heats water as the heat transfer medium to create hot water F4 (refer to FIG. 10 to be described later) and the hot water F4 is supplied to the cooling unit 46 to heat the solid-state imaging element 42.

In this manner, the cooling unit 46 is used not only to cool the cooling element 44 but is also used to heat the solid-state imaging element 42. In other words, in the second embodiment, the cooling unit 46 is thermally connected to the cooling element 44 and the solid-state imaging element 42 and functions as a heat source unit to which the heat transfer medium is supplied from the chiller 50.

In the X-ray detection system according to the second embodiment, the chiller 50 selectively generates cold water F2 and hot water F4 and the cold water F2 or the hot water F4 can be supplied from the chiller 50 to the cooling unit 46. Therefore, the solid-state imaging element 42 can be cleaned without dismounting the X-ray detection device 40 from the case of the X-ray detection system. In other words, the solid-state imaging element 42 can be cleaned in a same state as during the operation of the X-ray detection device 40. Therefore, an adjustment of the X-ray detection device 40 (for example, an adjustment of the light-receiving surface 43 of the solid-state imaging element 42) need not be performed after cleaning of the solid-state imaging element 42.

2.2. Cleaning Method of Solid-State Imaging Element

Figure 10:
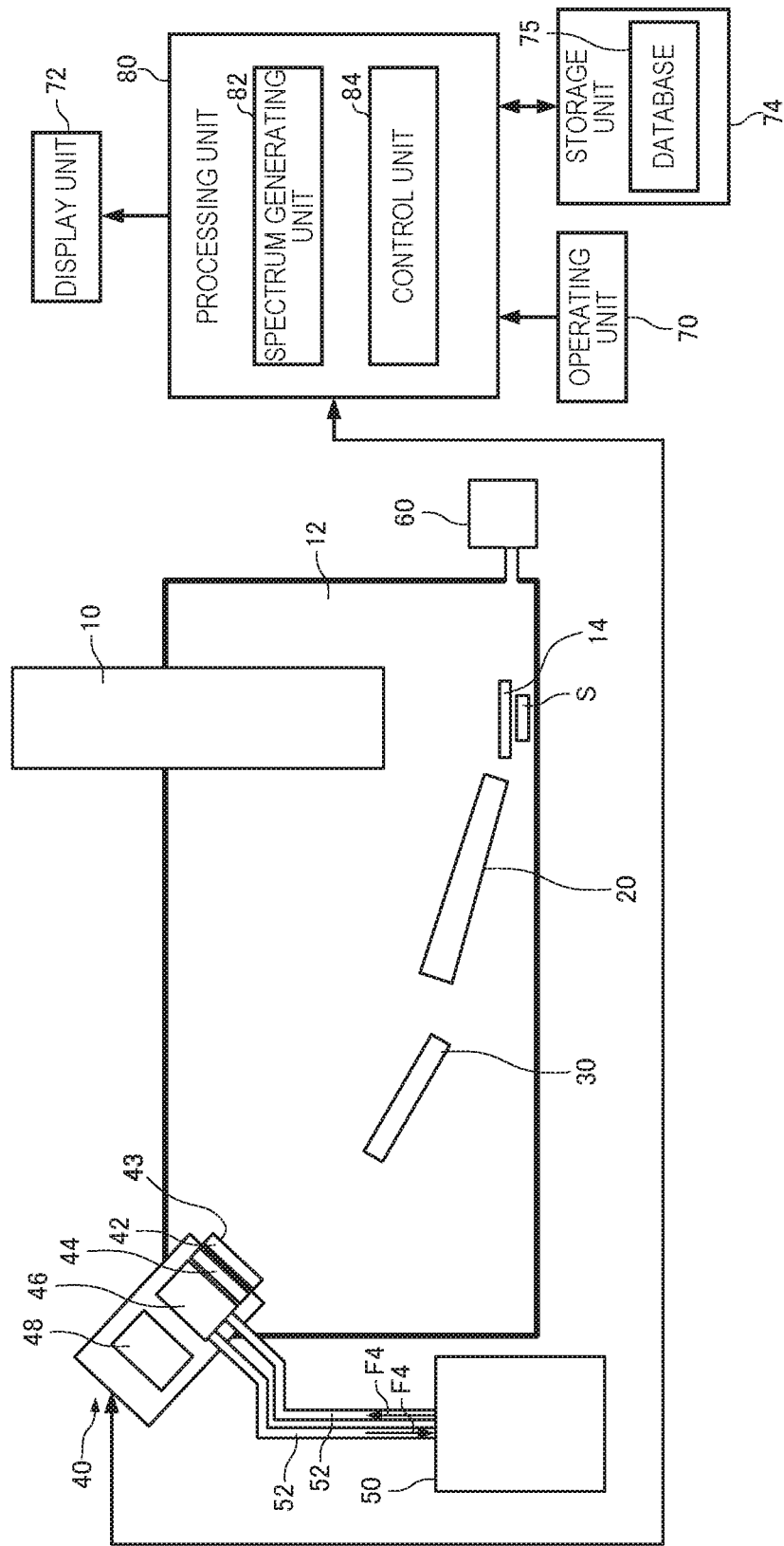
FIG. 10 is a diagram schematically illustrating a cleaning step of a solid-state imaging element according to a second embodiment.

Next, a cleaning method of a solid-state imaging element according to the second embodiment will be described with reference to the drawings. FIG. 10 is a diagram schematically illustrating a cleaning step of a solid-state imaging element according to the second embodiment.

First, an operation of the cooling element 44 is stopped. Next, as illustrated in FIG. 10, water as a heat transfer medium is heated by the chiller 50. For example, when the user operates the chiller 50 and specifies a temperature of water, the chiller 50 heats cold water F2 (for example, water at 20 degrees) to create hot water F4 at the specified temperature (for example, a temperature which causes a surface temperature of the solid-state imaging element 42 to reach or exceed 50 degrees). Accordingly, the hot water F4 is circulated between the cooling unit 46 and the chiller 50 via the pipe 52 and the solid-state imaging element 42 is heated. At this point, the exhaust device 60 is operational and is pumping the specimen chamber 12. Therefore, gas generated by heating the solid-state imaging element 42 is discharged.

The chiller 50 creates the hot water F4 by gradually increasing the temperature of the cold water F2. Accordingly, the possibility of breakage of the solid-state imaging element 42 attributable to an abrupt temperature rise of the solid-state imaging element 42 can be reduced.

By performing, for a prescribed period of time, processing for heating the solid-state imaging element 42 and, at the same time, discharging the gas generated by heating the solid-state imaging element 42, contamination accumulated on the light-receiving surface 43 of the solid-state imaging element 42 can be removed.

The solid-state imaging element 42 can be cleaned by the step described above.

After cleaning of the solid-state imaging element 42 is finished, when the user operates the chiller 50 and specifies a temperature of water, the chiller 50 cools the hot water F4 to create cold water F2 at the specified temperature (for example, water at 20 degrees) (refer to FIG. 1). Accordingly, the cooling element 44 is cooled. Next, the cooling element 44 is operated to cool the solid-state imaging element 42 to a state where the solid-state imaging element 42 becomes operational (a state where detection of X-rays can be performed).

With the cleaning method of the solid-state imaging element according to the second embodiment, the cooling element 44 is cooled by cooling water as the heat transfer medium when the solid-state imaging element 42 is operating and the solid-state imaging element 42 is heated by heating water as the heat transfer medium during a step of heating the solid-state imaging element 42. Therefore, with the cleaning method of the solid-state imaging element according to the second embodiment, the solid-state imaging element 42 can be cleaned in a same state as during operation of the X-ray detection device 40.

3. Third Embodiment

3.1. X-Ray Detection System

Figure 11:
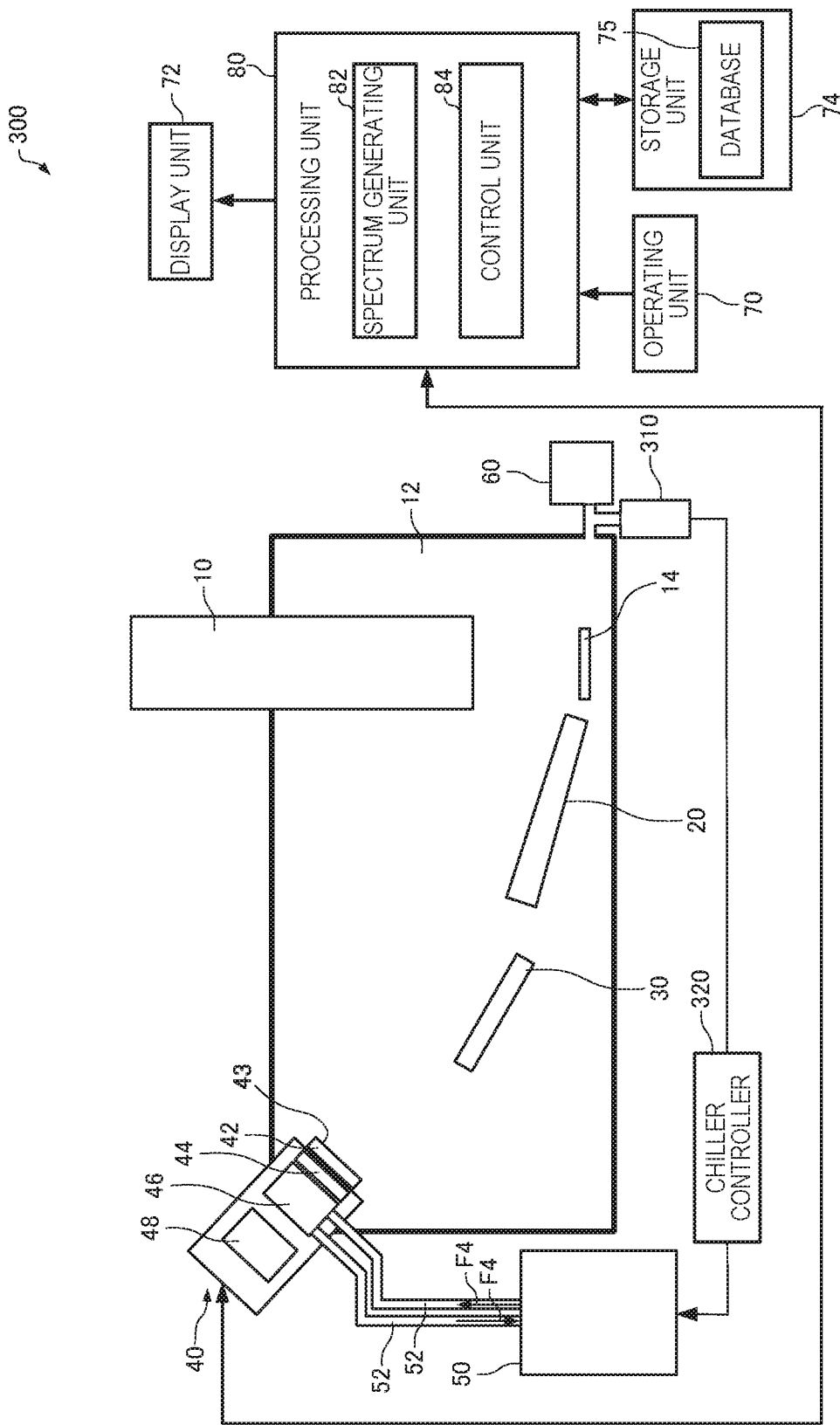
FIG. 11 is a diagram schematically illustrating an X-ray detection system according to a third embodiment.

Next, an X-ray detection system according to a third embodiment will be described with reference to the drawings. FIG. 11 is a diagram schematically illustrating an X-ray detection system 300 according to the third embodiment. FIG. 11 illustrates a cleaning step of the solid-state imaging element 42.

Hereinafter, in the X-ray detection system 300 according to the third embodiment, members having similar functions to the components of the X-ray detection systems 100 and 200 described earlier will be denoted by same reference characters and a detailed description thereof will be omitted.

As illustrated in FIG. 11, the X-ray detection system 300 is configured so as to include a vacuum gauge 310 and a chiller controller 320.

The vacuum gauge 310 measures pressure (a degree of vacuum) of a space (the specimen chamber 12) in which the solid-state imaging element 42 is disposed. The vacuum gauge 310 is, for example, a Pirani vacuum gauge or a Penning vacuum gauge.

The chiller controller 320 controls the chiller 50. For example, the chiller controller 320 controls the chiller 50 to control temperature of water as a heat transfer medium. Details of processing by the chiller controller 320 will be provided in "3.2. Cleaning method of solid-state imaging element" to be described later.

Functions of the chiller controller 320 can be implemented by having a processor (a CPU, a DSP, or the like) execute a program or by a dedicated circuit such as an ASIC (a gate array or the like). Although not shown, the chiller controller 320 is configured so as to include an operating unit.

3.2. Cleaning Method of Solid-State Imaging Element

Next, a cleaning method of a solid-state imaging element according to the third embodiment will be described.

When the user requests start of cleaning of the solid-state imaging element 42 via the operating unit, the chiller controller 320 starts processing for cleaning the solid-state imaging element 42 based on an operation signal from the operating unit.

The chiller controller 320 first controls the chiller 50 so that the chiller 50 heats water as a heat transfer medium to a temperature set in advance (for example, a temperature causing the surface temperature of the solid-state imaging element 42 to reach or exceed 50 degrees). Accordingly, the chiller 50 circulates the hot water F4 between the cooling unit 46 and the chiller 50 and the solid-state imaging element 42 is heated. At this point, the exhaust device 60 is operational and is pumping the specimen chamber 12. Therefore, gas generated by heating the solid-state imaging element 42 is discharged.

In this case, since gas is generated by heating the solid-state imaging element 42, pressure inside the specimen chamber 12 becomes higher (a degree of vacuum becomes lower) than, for example, pressure inside the specimen chamber 12 during an operation of the X-ray detection device 40. Subsequently, when cleaning proceeds and contamination accumulated on the surface of the solid-state imaging element 42 is reduced, pressure inside the specimen chamber 12 drops (the degree of vacuum rises).

Therefore, the chiller controller 320 monitors a measurement result of the vacuum gauge 310 and, based on the measurement result (an output signal) of the vacuum gauge 310, controls the chiller 50 so as to stop heating the water or, in other words, controls the chiller 50 so as to stop generating a heat transfer medium for heating the solid-state imaging element 42. More specifically, the chiller controller 320 monitors the output signal (the measurement result) of the vacuum gauge 310 and controls the chiller 50 so as to stop heating the water when the pressure inside the specimen chamber 12 drops to or below prescribed pressure (for example, pressure inside the specimen chamber 12 during an operation of the X-ray detection device 40). Accordingly, the chiller 50 stops heating the water.

The solid-state imaging element 42 can be cleaned by the step described above.

In the X-ray detection system 300, based on an output signal from the vacuum gauge 310, the chiller controller 320 controls the chiller 50 so as to stop generating a heat transfer medium for heating the solid-state imaging element 42 (controls the chiller 50 so as to stop heating water). Therefore, in the X-ray detection system 300, cleaning of the solid-state imaging element can be ended at an appropriate timing. In addition, in the X-ray detection system 300, since cleaning of the solid-state imaging element 42 can be automatically ended, an operation for ending the cleaning can be eliminated.

4. Fourth Embodiment

4.1. X-Ray Detection System

Figure 12:
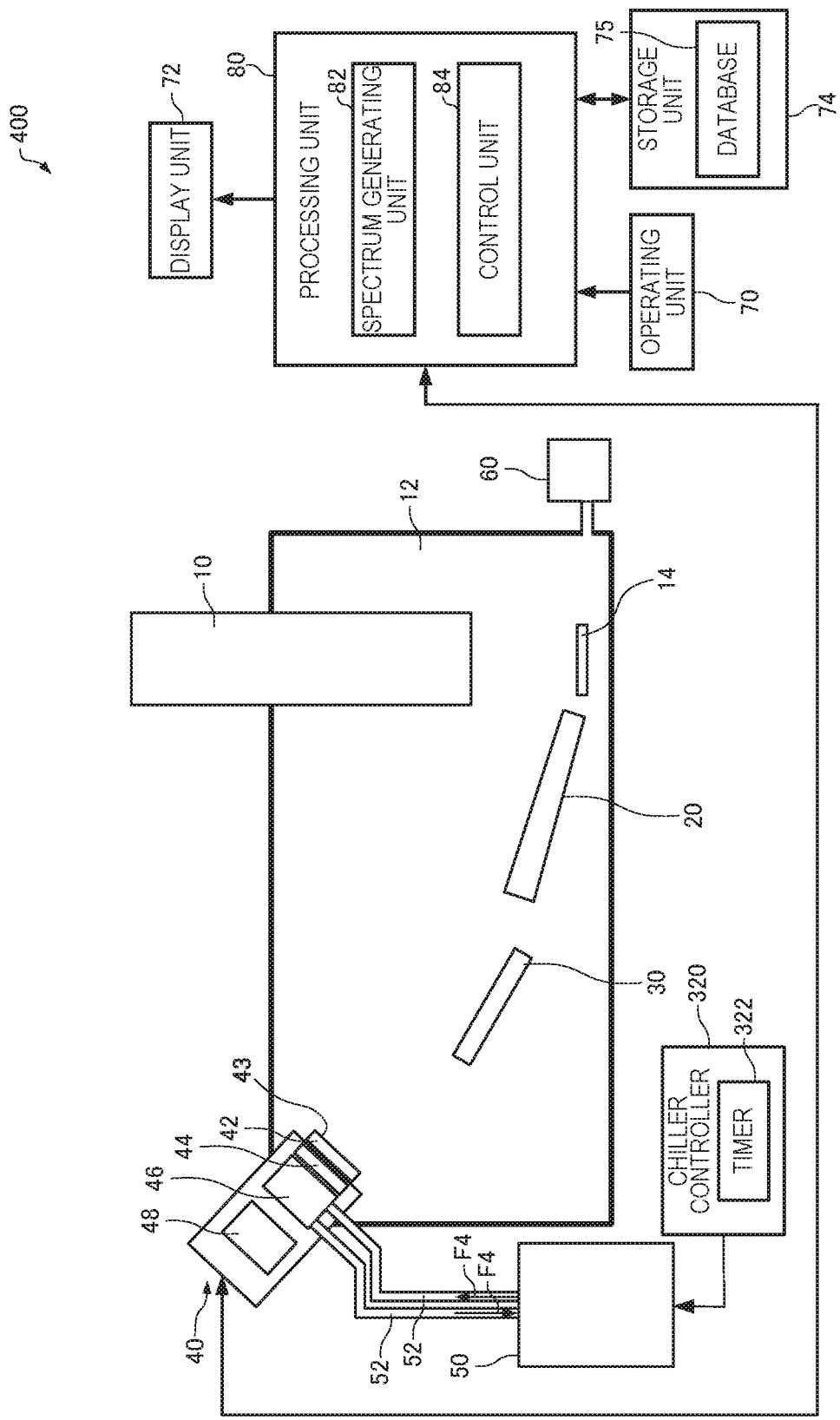
FIG. 12 is a diagram schematically illustrating an X-ray detection system according to a fourth embodiment.

Next, an X-ray detection system according to a fourth embodiment will be described with reference to the drawings. FIG. 12 is a diagram schematically illustrating an X-ray detection system 400 according to the fourth embodiment. FIG. 12 illustrates a cleaning step of the solid-state imaging element 42.

Hereinafter, in the X-ray detection system 400 according to the fourth embodiment, members having similar functions to the components of the X-ray detection systems 100, 200, and 300 will be denoted by same reference characters and a detailed description thereof will be omitted.

As illustrated in FIG. 12, the X-ray detection system 400 is configured so as to include the chiller controller 320 and the chiller controller 320 has a timer 322.

4.2. Cleaning Method of Solid-State Imaging Element

Next, a cleaning method of a solid-state imaging element according to the fourth embodiment will be described.

When the user requests start of cleaning of the solid-state imaging element 42 via the operating unit, the chiller controller 320 starts processing for cleaning the solid-state imaging element 42 based on an operation signal from the operating unit.

The chiller controller 320 first controls the chiller 50 so that the chiller 50 heats water as a heat transfer medium to a temperature set in advance. Accordingly, the chiller 50 circulates the hot water F4 between the cooling unit 46 and the chiller 50 and the solid-state imaging element 42 is heated. At this point, the exhaust device 60 is operational and is pumping the specimen chamber 12. Therefore, gas generated by heating the solid-state imaging element 42 is discharged.

In addition, the chiller controller 320 starts time measurement by the timer 322 in accordance with a request to start cleaning (in other words, based on an operation signal). Furthermore, the chiller controller 320 controls the chiller 50 to stop heating water when the timer 322 has measured a prescribed period of time. Accordingly, the chiller 50 stops heating the water. The prescribed period of time measured by the timer 322 is, for example, an arbitrary period of time set in advance.

The solid-state imaging element 42 can be cleaned by the step described above.

In the X-ray detection system 400 according to the fourth embodiment, the chiller controller 320 has the timer 322, and when the timer 322 has measured a prescribed period of time, the chiller controller 320 controls the chiller 50 so as to stop generating a heat transfer medium for heating the solid-state imaging element 42 (controls the chiller 50 so as to stop heating water). Therefore, in the X-ray detection system 400, cleaning of the solid-state imaging element can be ended at an appropriate timing. In addition, in the X-ray detection system 400, since cleaning of the solid-state imaging element 42 can be automatically ended, an operation for ending the cleaning can be eliminated.

5. Fifth Embodiment

5.1. X-Ray Detection System

Next, an X-ray detection system according to a fifth embodiment will be described with reference to the drawings. A configuration of the X-ray detection system according to the fifth embodiment is the same as the configuration of the X-ray detection system 300 according to the third embodiment illustrated in FIG. 11 and therefore will not be illustrated.

In the fifth embodiment, for example, when the user adds a command for performing cleaning of the solid-state imaging element 42 after a continuous measurement sequence in control software executed by the chiller controller 320, in accordance with the command, the chiller controller 320 starts processing for cleaning the solid-state imaging element 42 after continuous measurement is performed in the X-ray detection device 40.

The processing for cleaning the solid-state imaging element 42 by the chiller controller 320 is the same as "3.2. Cleaning method of solid-state imaging element" described earlier and a description thereof will be omitted.

In addition, in the processing for cleaning the solid-state imaging element 42, the chiller controller 320 may perform processing for stopping supply of power to the controller 48 of the X-ray detection device 40.

Alternatively, the chiller controller 320 may measure a total measurement time of the X-ray detection device 40 and start the processing for cleaning the solid-state imaging element 42 when the total measurement time equals or exceeds a prescribed period of time. In addition, the chiller controller 320 may notify the user to perform cleaning when the total measurement time equals or exceeds a prescribed period of time.

Alternatively, the chiller controller 320 may measure an operation time (a cooling time) of the solid-state imaging element 42 and perform the processing for cleaning the solid-state imaging element 42 or the processing for notifying to perform cleaning when the operation time equals or exceeds a prescribed period of time.

Alternatively, the chiller controller 320 may perform processing for monitoring a measurement result (an output signal) of the vacuum gauge 310 and recording a history of pressure (a degree of vacuum) in the specimen chamber 12. In addition, the chiller controller 320 may perform the processing for cleaning the solid-state imaging element 42 or the processing for notifying to perform cleaning when the number of times pressure has risen (the degree of vacuum has dropped) in the specimen chamber 12 during an operation period of the solid-state imaging element 42 equals or exceeds a prescribed number of times.

Furthermore, the chiller controller 320 may perform processing for monitoring a measurement result (an output signal) of the vacuum gauge 310 and recording a history of pressure (a degree of vacuum) in the specimen chamber 12. Alternatively, the chiller controller 320 may perform the processing for cleaning the solid-state imaging element 42 or the processing for notifying to perform cleaning when a period of time during which pressure in the specimen chamber 12 has risen to or exceeded prescribed pressure during an operation period of the solid-state imaging element 42 equals or exceeds a prescribed period of time.

As described above, in the X-ray detection system according to the fifth embodiment, cleaning of the solid-state imaging element 42 can be performed on a regular basis. In addition, in the X-ray detection system according to the fifth embodiment, the user can be regularly notified to clean the solid-state imaging element 42 as described above.

Furthermore, in the X-ray detection system according to the fifth embodiment, as described above, since the cleaning of the solid-state imaging element 42 can be performed based on a history of pressure (a degree of vacuum) of the specimen chamber 12, cleaning of the solid-state imaging element 42 can be performed at a more appropriate timing than, for example, when cleaning is performed based on an operation time of the solid-state imaging element 42.

This is because, for example, when introducing a specimen S having a large amount of degassed gas into the specimen chamber 12, contamination adhering to the surface of the solid-state imaging element 42 may increase even when the operation time of the solid-state imaging element 42 is short.

In the X-ray detection system according to the fifth embodiment, as described above, since the user can be notified to clean the solid-state imaging element 42 based on a history of pressure (a degree of vacuum) of the specimen chamber 12, cleaning of the solid-state imaging element 42 can be performed at a more appropriate timing.

The present invention is not limited to the embodiments described above, and various modifications and variations of the above embodiments may be made without departing from the scope of the present invention.

For example, while the solid-state imaging element 42 has been described as an example of a detector for detecting X-rays in the embodiments presented above, the detector in the X-ray analyzer according to the present invention is not limited to the solid-state imaging element 42. As the detector used in the X-ray analyzer according to the present invention, for example, a silicon-drift detector (SDD), a windowless EDS detector, or an X-ray microcalorimeter can be used.

In addition, for example, while a case where the solid-state imaging element 42 is heated by a heating heat transfer medium such as the hot water F4 in the cleaning of the solid-state imaging element 42 has been described in the embodiments presented above, alternatively, for example, the solid-state imaging element 42 may be heated by inverting a polarity of a direct current supplied to a Peltier element as the cooling element 44 from a state where the solid-state imaging element 42 is being cooled. In this manner, by inverting the polarity of a direct current supplied to a Peltier element, a cooling side and a heating side of the Peltier element are reversed and the solid-state imaging element 42 can be heated.

Furthermore, for example, while a case where the X-ray detection device 40 detects X-rays generated from a specimen S by irradiating the specimen S with an electron beam has been described in the embodiments presented above, the primary ray to irradiate the specimen S is not limited to an electron beam and X-rays, ions, or the like may be used instead.

It should be noted that the embodiments and the modifications described above are merely examples and the invention is not limited thereto. For example, the respective embodiments and the respective modifications may be combined as appropriate.

The invention includes various other configurations that are substantially identical to the configurations described in the embodiments (for example, configurations having identical functions, methods, and results or configurations having identical objectives and effects). The invention also includes various other configurations in which non-essential elements described in the embodiments are replaced by other elements. The invention also includes various other configurations having the same effects as those of the configurations described in the embodiments, or various other configurations capable of achieving the same objectives as those of the configurations described in the embodiments. Furthermore, the invention includes various other configurations in which known techniques are added to the configurations described in the embodiments.

Some embodiments of the invention have been described in detail above, but a person skilled in the art will readily appreciate that various modifications can be made from the embodiments without materially departing from the novel teachings and effects of the invention. Accordingly, all such modifications are assumed to be included in the scope of the invention.

What is claimed is:

1. An X-ray analyzer comprising:
   a detector which detects X-rays generated from a specimen;
   a cooling element which cools the detector; and
   a spectrum generating unit which generates a spectrum based on a detection signal from the detector,
   the spectrum generating unit correcting an attenuation of intensity of a spectrum attributable to contamination of the detector, based on an elapsed time from a reference time until the X-rays are detected.

2. The X-ray analyzer according to claim 1,
   wherein the spectrum generating unit corrects an attenuation of intensity of a spectrum for each energy.

3. The X-ray analyzer according to claim 1, further comprising:
   a storage unit which stores a database indicating a relationship between an elapsed time from the reference time and an attenuation rate of intensity of a spectrum for each energy,
   wherein the spectrum generating unit acquires information on an attenuation rate of intensity of a spectrum from the database to correct an attenuation of intensity of a spectrum.

4. The X-ray analyzer according to claim 1,
   wherein the reference time is a time point when the temperature of the detector reaches a temperature at which the detector becomes capable of detection.

5. The X-ray analyzer according to claim 1, further comprising:
   a control unit which controls the cooling element,
   wherein the control unit performs:
   processing for stopping an operation of the cooling element at a first time point which has been set; and
   processing for starting an operation of the cooling element at a second time point which has been set.

6. The X-ray analyzer according to claim 5, further comprising:
   an input unit which accepts an input of the first time point and an input of the second time point.

7. The X-ray analyzer according to claim 1, further comprising:
   a heat transfer medium generating unit which selectively generates a heat transfer medium for cooling the cooling element, and a heat transfer medium for heating the detector;
   a heat source unit which is thermally connected to the cooling element and the detector and to which a heat transfer medium is supplied from the heat transfer medium generating unit; and
   an exhaust device connected to a space in which the detector is disposed.

8. A spectrum generation method for an X-ray analyzer which includes a detector for detecting X-rays generated from a specimen, and a cooling element for cooling the detector,
   the method comprising, when a spectrum is generated based on an output signal from the detector, correcting an attenuation of intensity of a spectrum attributable to contamination of the detector, based on an elapsed time from a reference time until the X-rays are detected.

9. The spectrum generation method according to claim 8, further comprising:
   obtaining a relationship between an elapsed time from the reference time and a thickness of a deposition film deposited on the detector,
   obtaining a relationship between an elapsed time from the reference time and an attenuation rate of intensity of a spectrum based on the relationship between an elapsed time from the reference time and a thickness of the deposition film, and
   correcting an attenuation of intensity of a spectrum based on the obtained relationships.

* * * * *

UNITED STATES PATENT AND TRADEMARK OFFICE
CERTIFICATE OF CORRECTION

PATENT NO. : 10,739,284 B2
APPLICATION NO. : 16/101633
DATED : August 11, 2020
INVENTOR(S) : Takanori Murano It is certified that error appears in the above-identified patent and that said Letters Patent is hereby corrected as shown below:

In the Specification

Column 1, Lines 4-6, delete:
"Japanese Patent Application No. 2017-156519, filed on Aug. 14, 2017, is hereby incorporated by reference in its entirety."
And insert:
-- CROSS REFERENCE TO RELATED APPLICATION
This application claims priority to Japanese Patent Application No. 2017-156519 filed August 14, 2017, the disclosure of which is hereby incorporated in its entirety by reference. --

Signed and Sealed this
Twenty-third Day of February, 2021

Drew Hirshfeld
*Performing the Functions and Duties of the*
*Under Secretary of Commerce for Intellectual Property and*
*Director of the United States Patent and Trademark Office*